(12) United States Patent
Inoue

(10) Patent No.: US 8,258,039 B2
(45) Date of Patent: Sep. 4, 2012

(54) SEMICONDUCTOR DEVICE AND MANUFACTURING METHOD THEREOF

(75) Inventor: Ken Inoue, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 200 days.

(21) Appl. No.: 12/801,867

(22) Filed: Jun. 29, 2010

(65) Prior Publication Data

US 2011/0001216 A1 Jan. 6, 2011

(30) Foreign Application Priority Data

Jul. 2, 2009 (JP) ................................. 2009-157858

(51) Int. Cl.
*H01L 21/20* (2006.01)
(52) U.S. Cl. .. 438/386; 257/296; 257/305; 257/E27.048
(58) Field of Classification Search .................. 438/386, 438/532; 257/296, 305, E27.048
See application file for complete search history.

(56) References Cited

U.S. PATENT DOCUMENTS

| 6,770,930 B2 | 8/2004 | Oashi |
| 6,965,139 B2 | 11/2005 | Ohno |
| 2003/0052350 A1 | 3/2003 | Ohno |
| 2003/0168715 A1* | 9/2003 | Bae ................................. 257/529 |
| 2004/0016946 A1 | 1/2004 | Oashi |
| 2007/0173012 A1 | 7/2007 | Aoki |
| 2010/0320566 A1* | 12/2010 | Manning et al. ............... 257/532 |

FOREIGN PATENT DOCUMENTS

| JP | 2000-332216 | 11/2000 |
| JP | 2004-63559 | 2/2004 |
| JP | 2004-342787 | 12/2004 |
| JP | 2005-5337 | 1/2005 |
| JP | 2005-86150 | 3/2005 |
| JP | 2005-101647 | 4/2005 |
| JP | 2007-201101 | 8/2007 |

* cited by examiner

*Primary Examiner* — Jarrett Stark
*Assistant Examiner* — John M Parker
(74) *Attorney, Agent, or Firm* — McGinn IP Law Group, PLLC

(57) ABSTRACT

A manufacturing method of a semiconductor device includes: forming a wiring in a first interlayer insulating layer in a first region; etching an surface portion of the first interlayer insulating layer in a second region; forming a plurality of opening portions extended below in the etched region; and forming a lower electrode layer, a dielectric layer, and a common upper electrode in each of the plurality of opening portions to form a plurality of capacitance portions. The step of forming the plurality of capacitance portions, includes: forming the common upper electrode so that an upper surface of the first interlayer insulating layer and an upper surface of the common upper electrode approximately lie in the same plane.

10 Claims, 16 Drawing Sheets

SEMICONDUCTOR DEVICE AND MANUFACTURING METHOD THEREOF

INCORPORATION BY REFERENCE

This application is based upon and claims the benefit of priority from Japanese patent application No. 2009-157858 filed on Jul. 2, 2009, the disclosure of which is incorporated herein in its entirety by reference.

BACKGROUND OF THE INVENTION

1. Field of the Invention

The present invention relates to a semiconductor device and a manufacturing method thereof, and in particular relates to a semiconductor device having co-loaded a DRAM portion and a logic portion and a method of manufacturing the same.

2. Description of Related Art

There is known a semiconductor device having a memory, e.g., a DRAM (Dynamic Random Access Memory) and a logic circuit co-loaded on a semiconductor substrate. For example, Japanese Patent Publication No. JP2000-332216A (corresponding to U.S. Pat. No. 6,965,139 (B2)) discloses a semiconductor device in which a semiconductor memory including a memory cell portion and a peripheral circuit portion and a logic circuit are co-loaded on the same semiconductor substrate. FIG. 1 is a sectional view showing a configuration of this semiconductor device. In this semiconductor device 101, a capacitive element C (124, 125, 126) is formed above bit lines BL (119: 119A, 119B) in the memory cell portion 102. Word lines WL (117) are formed in a direction perpendicular to the bit lines BL. In the peripheral circuit portion 103 and the logic circuit 104, there is formed a first metal layer 128 including an embedded metal layer which is embedded within a connection hole penetrating insulating films 115, 116, 118, 120, 121, 122, 127A (127) and is connected with a diffusion later 113A formed in the semiconductor substrate 110, or connected with a lower layer wiring 114 (114A, 114B) on the semiconductor substrate 110. A first metal wiring layer 129 (129A, 129B, 129C) is connected with the first metal layer 128 and is formed generally in parallel to a main surface of the semiconductor substrate 110. A second metal layer 131 (, 131P, 131Q) including an embedded metal layer 131A (, 131B) embedded within a connection hole penetrating insulating films 127B (127), 130 is formed to be connected with the first metal wiring layer 129. A second metal wiring layer 132(, 132P, 132Q (132A, 132B, 132C)) is formed on the upper insulating film 130 above the capacitive element C and is connected with the second metal layer 131. In the memory cell portion 102, there is formed a groove penetrating insulating layers 127B, 127A sandwiching the first metal wiring layer 129 from above and below the same. The capacitive element C is formed within the groove and on the insulating layers. An N-well 111N, a P-well 111P and STIs 12 are formed in the semiconductor substrate 110.

Moreover, relating to a semiconductor device having co-loaded a memory and a logic circuit, there is disclosed a technique as follows. Japanese Patent Publication No. JP2004-342787A discloses a semiconductor device and a method of manufacturing the same. This semiconductor device is provided with a first interlayer insulating film, a lower electrode contact plug, a second interlayer insulating film, and a capacitor portion. The first interlayer insulating film is formed on a semiconductor substrate. The lower electrode contact plug is formed to penetrate the first interlayer insulating film. The second interlayer insulating film is formed on the first interlayer insulating film. The capacitor portion includes a lower electrode, a dielectric layer and an upper electrode which are formed in a capacitor opening portion penetrating the second interlayer insulating film and reaching onto the lower electrode contact plug. The second interlayer insulating film is formed of a plurality of layers of insulating films. This semiconductor device is further provided with a damascene shaped wiring film containing a copper and an upper layer wiring film formed on the second interlayer insulating film through an upper layer contact hole reaching onto the damascene shaped wiring film. The damascene shaped wiring film is formed on any of the insulating films lower than the upper surface of the second interlayer insulating film. The damascene shaped wiring film has a contact plug embedded in a contact hole. The contact hole penetrates the any of the insulating films, the insulating film below the any of the insulating films and the first interlayer insulating film.

Japanese Patent Publication No. JP2007-201101A (corresponding to U.S. Patent Publication No. 2007173012 (A1)) discloses an integrated circuit device and a method for manufacturing a circuit. In this integrated circuit device, a memory portion including a plurality of capacitive elements and a logic portion including logic circuits are arranged alongside with each other. Each of the capacitive elements includes an upper electrode, a capacitive insulating film and a lower electrode. The memory portion is formed to have a COB (Capacitor over Bit line) structure in which an upper capacitive wiring connected to the upper electrode is positioned above the capacitive elements and a lower capacitive wiring connected to the lower electrode is positioned below the capacitive elements. In this integrated circuit device, the plurality of capacitive elements and at least one logic contact connected to the logic circuit are embedded in an interlayer insulating film. This interlayer insulating film, the logic contact and upper surfaces of the upper electrodes of the plurality of capacitive elements are arranged to form a plane. A logic wiring formed on the plane is connected with the logic contact and the upper capacitive wirings are connected to the upper electrodes of the plurality of capacitive elements.

Japanese Patent Publication No. JP2005-101647A discloses a semiconductor integrated circuit device and a method for manufacturing the same. In this semiconductor integrated circuit device, a MISFET for selecting a memory cell is formed in a memory cell array region on a main surface of a semiconductor substrate, and a MISFET for a peripheral circuit or a MISFET for a logic circuit is formed in a peripheral circuit region or a logic circuit region of the semiconductor substrate, respectively. A first insulating film is so formed as to cover the MISFET for selecting a memory cell and the MISFET for the peripheral circuit or the MISFET for the logic circuit. Bit lines are formed on the first insulating film in the memory cell array region and a first layer wiring made of the same material as the bit lines is formed on the first insulating film in the peripheral circuit region or the logic circuit region. A second insulating film covering the bit lines and the first layer wiring and having its surface flattened is formed on the memory cell array region and the peripheral circuit region or the logic circuit region. An etching stopper film covering the second insulating film is formed on the memory cell array region and the peripheral circuit region or the logic circuit region. A third insulating film is formed on the etching stopper film. The third insulating film of the memory cell array region is provided with a lower electrode, a capacitive insulating film covering the lower electrode and an upper electrode of a capacitive element for accumulating information. A fourth insulating film is formed on the third insulating film, the capacitive element for accumulating information and the peripheral circuit region or the logic circuit region. The etching stopper film does not exist under the lower electrode but exist in the region on the second insulating film in a state of contacting a side wall of the lower electrode so that the etching stopper film functions as an etching stopper when etching the third insulating film.

Japanese Patent Publication No. JP2005-86150A discloses a semiconductor device and a manufacturing method thereof. This semiconductor device includes a semiconductor substrate, a first insulating film formed on the semiconductor substrate, a capacitor formed on the first insulating film, and a second insulating film cover ring the capacitor, which is of a composition different from that of the first insulating film. A contact hole is formed in the first insulating film by etching the first insulating film with the second insulating film serving as a mask.

Japanese Patent Publication No. JP2005-5337A discloses a manufacturing method of a semiconductor integrated circuit device with a co-loaded DRAM. In this manufacturing method of a semiconductor integrated circuit device with a co-loaded DRAM, a DRAM portion and a peripheral logic portion are formed on a semiconductor substrate. The manufacturing method of a semiconductor integrated circuit device with a co-loaded DRAM includes: a first step of forming a gate electrode on the semiconductor substrate through a gate insulating film and forming a source/drain implantation layer in the semiconductor substrate; a second step of depositing a first nitride film on the semiconductor substrate including the gate electrode, depositing a first interlayer insulating film on the first nitride film, forming a first contact hole which penetrates the first nitride film and the first interlayer insulating film to reach the source/drain implantation layer, and forming a first plug within the first contact hole; a third step of depositing a second nitride film on the semiconductor substrate provided with the first plug and a second interlayer insulating film on the second nitride film, etching a capacitor formation portion of the deposited second nitride film and the second interlayer insulating film so as to reach the first plug, depositing a first conductive film on the etched capacitor formation portion, and forming a capacitor lower electrode by etching back overall the deposited first conductive film and remaining the first conductive film on a side wall and a bottom portion of the capacitor formation portion; a fourth step of depositing a dielectric layer on the capacitor lower electrode and a second conductive film on the dielectric layer, and forming a capacitor upper electrode only on the side wall and the bottom portion of the capacitor formation portion by etching back or CMP (Chemical-Mechanical Polishing) of the deposited second conductive film; a fifth step of forming a second contact hole at a bit line contact portion so as to penetrate the second nitride film and the second interlayer insulating film to reach the first plug, and forming a second plug within the second contact hole; and after the fifth step, a sixth step of forming a wiring above the second interlayer insulating film through an insulating film for connecting all of the capacitor upper electrodes of the DRAM portion.

Japanese Patent Publication No. JP2004-63559A (corresponding to U.S. Pat. No. 6,770,930 (B2)) discloses a semiconductor device. This semiconductor device has a multilayer structure. This semiconductor device includes: a capacitor disposed in an upper main surface of a first region of an interlayer insulating film; and a wiring layer disposed in an upper main surface of a second region of the interlayer insulating film. The capacitor includes: a capacitor upper electrode provided to be embedded in the upper main surface of the first region of the interlayer insulating film; a capacitor dielectric layer provided to cover at least a side surface and a lower surface of the capacitor upper electrode; and at least one lower electrode-and-plug electrically connecting the capacitor to a configuration provided under the capacitor and having a portion inserted in a thickness direction of the capacitor upper electrode, the inserted portion functioning as a capacitor lower electrode. The capacitor dielectric layer further covers a surface of the inserted portion of the at least one lower electrode-and-plug. The wiring layer is electrically connected to a configuration provided under the wiring layer by at least one contact plug having a portion inserted in a thickness direction of the wiring layer.

I have now discovered the following facts.

In recent years, as developments of semiconductor devices have been progressed to be finer and finer, there have been increasing severe demands for steps, sizes and margins in designing. In a semiconductor device having a DRAM portion and a logic portion co-loaded with each other, there arises an undesirable matter that a height of a wiring layer in the logic portion and a height of an upper surface of a capacitor in the DRAM portion are different in level in a manufacturing process. In the case of the semiconductor device shown in FIG. 1, there arises a step, for example, between a surface of D2 and a surface of D1 in height level. Under this condition, if a height of a via 131P connected to a capacitance plate E in the DRAM portion 102 and a height of a via 131Q in the logic circuit 104 are both intended to be made to correspond to a reference of a wiring design parameter (e.g., a reference for defining a via height and a wiring height to be constant in each layer), it may be considered to make the thickness of the interlayer film 130 uniform between the DRAM portion and the logic portion. However, in this case, there occurs a step in the interlayer film 130 at a contacting portion between the surface of D2 and the surface of D1. If so, it is difficult to connect wirings on the interlayer film 130 thereafter, and a process of forming a wiring by CMP thereafter also becomes difficult.

In order to avoid such a step on the interlayer film 130 as described above, it may be considered to make only the height of the via 131P in the DRAM portion correspond to a reference of a wiring design parameter. In this case, however, the height of the via 131Q in the logic portion becomes higher than the reference by a difference corresponding to the step. Meanwhile, it may be considered to make only the height of the via 131Q in the logic portion correspond to the reference mentioned above. In this case, however, the height of the via 131P in the DRAM portion becomes lower than the reference by a difference corresponding to the step (as shown in FIG. 1 for example). If so, a resistance of the via is out of the corresponding reference. In this manner, since there exists a variation in height corresponding to a step at a portion (e.g., the via in the DRAM portion) which cannot be treated using the wiring design parameter, it is difficult to predict a resistance value. Particularly, in the case where the portion (e.g., the via in the DRAM portion) containing a variation in height and the portion (e.g., the via in the logic portion) containing no variation in height are simultaneously deigned, there may easily cause an error. That is, since the configurations of the vias in the wiring layers (including a via layer with a via and a metal layer with a metal wiring) provided on and above the surface of the capacitance plate are not the same between the DRAM portion (capacitance plate) and the logic portion, it becomes difficult to predict the resistance value of the via and an error may be easily caused.

SUMMARY

The present invention seeks to solve one or more of the above problems, or to improve upon those problems at least in part.

In one embodiment, manufacturing method of a semiconductor device includes: forming a wiring in a first interlayer insulating layer in a first region; etching a surface portion of the first interlayer insulating layer in a second region; forming a plurality of opening portions extended below in the etched region; and forming a lower electrode layer, a dielectric layer, and a common upper electrode in each of the plurality of opening portions to form a plurality of capacitance portions, wherein the forming the plurality of capacitance portions, includes: forming the common upper electrode so that an upper surface of the first interlayer insulating layer and an upper surface of the common upper electrode approximately lie in the same plane.

In another embodiment, a semiconductor device includes: a wiring configured to be formed in a surface portion of a first interlayer insulating layer in a first region; a common upper electrode configured to be formed in a surface portion of the first interlayer insulating layer in a second region; a plurality of capacitance portions configured to have the common upper electrode as an upper electrode and be extended below, wherein an upper surface of the first interlayer insulating layer and an upper surface of the common upper electrode approximately lie in the same plane.

According to a semiconductor device and a manufacturing method thereof of the present invention, it is possible to make heights of wiring layers correspond to each other between a logic portion and an upper surface of a capacitance plate to which a plurality of capacitance portions is connected in a semiconductor device with a co-loaded memory portion.

BRIEF DESCRIPTION OF THE DRAWINGS

The above and other objects, advantages and features of the present invention will be more apparent from the following description of certain preferred embodiments taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Embodiments of a semiconductor device and a manufacturing method thereof according to the present invention will be described below with reference to the accompanying drawings.

Figure 2:
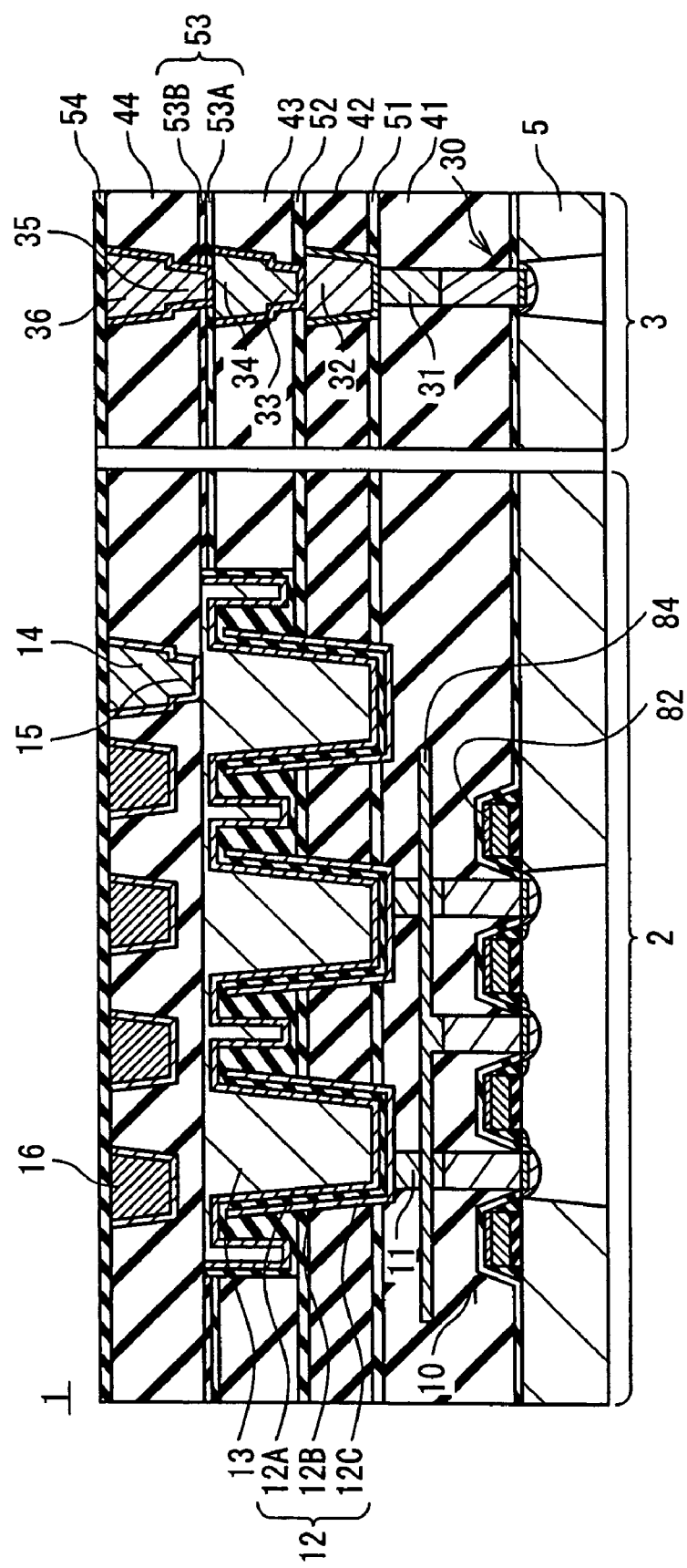
FIG. 2 is a cross-sectional view showing a configuration of a semiconductor device according to an embodiment of the present invention.

First, a configuration of the semiconductor device according to an embodiment of the present invention is explained. FIG. 2 is a cross-sectional view showing the configuration of the semiconductor device according to the embodiment of the present invention. On this semiconductor device 1, a memory portion 2 and a logic portion 3 are co-loaded. This semiconductor device 1 is exemplified as a DRAM co-loaded device having a COM (Capacitor Over Metal) structure.

The memory portion 2 (second region) includes a plurality of memory cells in an array form and functions as a memory co-operated with a peripheral circuits. The memory portion 2 is exemplified as a DRAM. The memory portion 2 includes cell transistors 10, a plurality of capacitance portions 12, upper wirings 14 and 16, a bit line 84 and a word line 82 (i.e., a gate of each cell transistor 10).

The cell transistors 10, although not shown in detail in this figure, are provided on and above a surface region of a semiconductor substrate 5. Each cell transistor 10 is connected to the capacitance portion 12 to constitute a memory cell. The memory cell is disposed at a position corresponding to an intersection of the word line and the bit line.

A plurality of capacitance portions 12 are provided above the cell transistors 10. The capacitance portions 12 accumulate electric charges as information in the memory cell. Each of the capacitance portions 12 is a half-crown shaped capacitance element having a MIM (Metal Insulator Metal) structure with its bottom facing the semiconductor substrate 5. The capacitance portion 12 includes a lower electrode 12C, a dielectric layer 12B, an upper electrode 12A and another upper electrode 13. The lower electrode 12C is connected to the cell transistor 10 through a contact 11 and is exemplified as a TiN (titanium nitride) layer. The dielectric layer 12B is provided on the lower electrode 12C and is exemplified as a $ZrO_2$ (zirconium oxide) layer. The upper electrode 12A is provided on the dielectric layer 12C and is exemplified as a TiN layer. The upper electrode 13 is provided on the upper electrode 12A so that the inside of the half-crown shaped portion is buried with the upper electrode 13, and is exemplified as a W (tungsten) layer. At least the upper electrode 13 of the upper electrodes 12A and 13 is commonly shared by the plurality of capacitance portions 12. Therefore, the commonly shared upper electrode 13 may be regarded as a common upper electrode. It is noted here that the capacitance portion 12 may be a cylinder type capacitance element or a crown type capacitance element.

The capacitance portion 12 is provided with its bottom formed of an upper surface region of an interlayer insulating layer 41 covering the cell transistors 10 and is so provided as to penetrate a surface-layered insulating layer 51 on the interlayer insulating layer 41, an interlayer insulating layer 42, a surface-layered insulating layer 52, an interlayer insulating layer 43, a surface-layered insulating layer 53, in this order from the bottom. The upper surface of the upper electrode 13 provided inside the half-crown shaped portion is coplanar with an upper surface of a first interlayer layer including the interlayer insulating layer 43 and the surface-layered insulating layer 53, having the same height from the surface of the semiconductor substrate 5 within a range of a production error. That is, it may be considered that the upper surface of the upper electrode 13 is included in the upper surface of the first interlayer layer. In this case, there is no surface-layered insulating layer 53 in the entire region on the upper electrode 13 commonly shared to the plurality of capacitance portions 12. The plurality of capacitance portions 12 are generally covered with an interlayer insulating layer 44.

The upper wirings 14 and 16 are embedded in the surface region of the interlayer insulating layer 44 (i.e., second interlayer layer). The upper wiring 14 is connected to the upper wiring 13 in the lower layer through a via 15 provided in a manner of penetrating the interlayer insulating layer 44. The upper surfaces of the upper wirings 14 and 16 are covered with the surface-layered insulating layer 54. The upper wirings 14 and 16 and the via 15 are exemplified as a laminated layer (barrier film)/Cu (copper) film, the laminated layer being composed of a TaN (tantalum nitride) film and a Ta (tantalum) film.

The logic portion 3 (i.e., first region) is an assembly of a plurality of logic elements and has a function of processing information. The logic portion 3 is exemplified as a circuit for implementing a function of a CPU (Central Processing Unit). The logic portion 3 includes a circuit 30, wirings 32 and 34, and an upper wiring 36.

The circuit 30, although not shown in details in the figure, includes a logic circuit and a peripheral circuit. The logic circuit in the circuit 30 is provided on and above the surface region of the semiconductor substrate 5. The logic circuit executes a function of processing information. The logic circuit is generally covered with the interlayer insulating layer 41. The wiring 32 is embedded in the surface-layered insulating layer 51 and the interlayer insulating layer 42 on and above the interlayer insulating layer 41. The wiring 32 is connected to the logic circuit through a contact 31 penetrating the interlayer insulating layer 41. The upper surface of the wiring 32 as well as the interlayer insulating layer 42 is covered with the surface-layered insulating layer 52. The surface-layered insulating layer 52 is covered with the interlayer insulating layer 43. The wiring 34 is embedded in the surface region of the interlayer insulating layer 43. The wiring 34 is connected to the wiring 32 through a via 33 which penetrates the interlayer insulating layer 43 and the surface-layered insulating layer 52. The upper surface of the wiring 34 as well as the interlayer insulating layer 43 is covered with the surface-layered insulating layer 53. The interlayer insulating layer 43 and the surface-layered insulating layer 53 constitute the first interlayer layer. The upper surface of the first interlayer layer (i.e., the upper surface of the surface-layered insulating layer 53) is coplanar with the upper surface of the upper electrode 13 of the memory portion 2, having the same height in level from the surface of the semiconductor substrate 5 within a range of the production error. The surface-layered insulating layer 53 is covered with the interlayer insulating layer 44.

In addition, the peripheral circuit of the circuit 30 is provided on and above the surface region of the semiconductor substrate 5. The peripheral circuit has a function of controlling an operation of the memory cell. Various circuits such as a control circuit, a sense amplifier and a decoder for driving the memory cell 2 are provided as the peripheral circuit. The peripheral circuit is generally covered with the interlayer insulating layer 41.

The upper wiring 36 is embedded in a surface region of the interlayer insulating layer 44 (i.e., second interlayer layer). The upper wiring 36 is connected to the wiring 34 through a via 35 penetrating the interlayer insulating layer 44 and the surface-layered insulating layer 53. The upper surface of the upper wiring 36 as well as the interlayer insulating layer 44 is covered with a surface-layered insulating layer 54. The wirings 32 and 34 and the upper wiring 36 and the vias 33 and 35 are exemplified as a laminated layer (barrier film)/Cu (copper) film, the laminated layer being composed of a TaN (tantalum nitride) film and a Ta (tantalum) film.

In this configuration, as described above, the upper surface of the surface-layered insulating layer 53 is generally coplanar with the upper surface of the upper electrode 13. That is, the upper surface of the upper electrode 13 may be regarded as being included in the upper surface of the surface-layered insulating layer 53. In addition, there is not any step on the upper surface of the surface-layered insulating layer 53 due to the upper electrode 13. Hence, a defective portion such as a failure in wirings due to a step can be avoided from occurring. Moreover, when forming the interlayer insulating layer 44 on the surface-layered insulating layer 53 and thereafter, the same wiring design parameter can be used both in common to the memory portion 2 and the logic portion 3.

Next, an embodiment of a manufacturing method of a semiconductor device according to the present invention will be described below. FIGS. 3 to 13 are cross-sectional views showing the manufacturing method of the semiconductor device according to the embodiment of the present invention.

Figure 3:
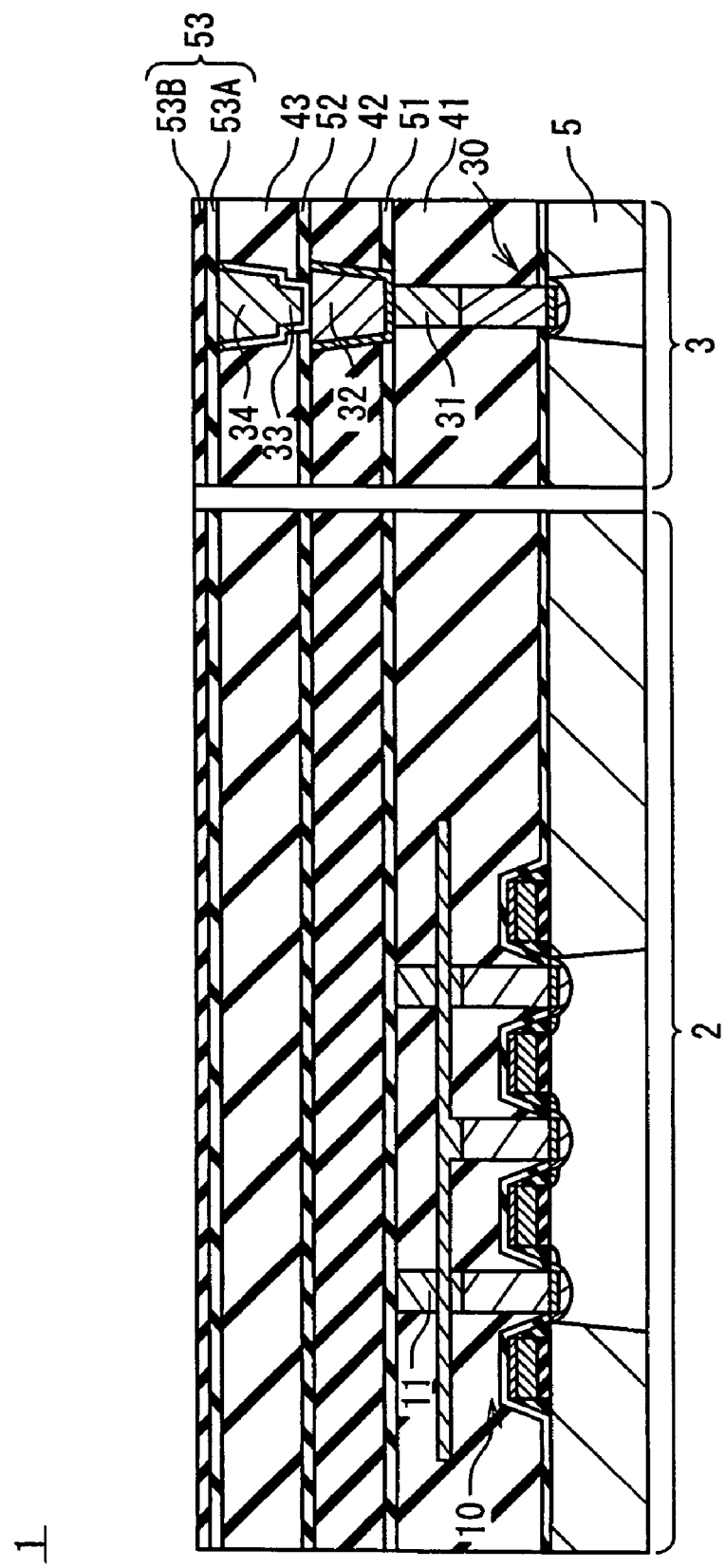
FIG. 3 is a cross-sectional view showing a manufacturing method of the semiconductor device according to an embodiment of the present invention.

As shown in FIG. 3, initially, the interlayer insulating layer 41 (e.g., $SiO_2$ (silicon oxide) film) is formed so as to cover the cell transistors 10 etc. in the memory portion 2 and the circuit 30 etc. in the logic portion 3. Then, the contacts 11 and 31 are formed at prescribed positions in the memory portion 2 and the logic portion 3, respectively, in the interlayer insulating layer 41. Subsequently, the surface-layered insulating layer 51 (e.g., SiC (carbonized silicon) film/SiCN (carbonized silicon nitride) film) is formed as an etching stopper film on the interlayer insulating layer 41, and the interlayer insulating layer 42 (e.g., molecular-pore interlayer film SiOCH: low-k film) is formed on the surface-layered insulating layer 51. Thereafter, the wiring 32 (M1) is formed (damascene shaped) in the logic portion 3 so as to penetrate the surface-layered insulating layer 51 and the interlayer insulating layer 42 and to be connected with the contact 31. Subsequently, the surface-layered insulating layer 52 (e.g., SiC film/SiCN film) is formed as an etching stopper film on the interlayer insulating layer 42, and the interlayer insulating layer 43 (e.g., molecular-pore interlayer film SiOCH: low-k film) is formed on the surface-layered insulating layer 52. Subsequently, the via 33 (V1) is formed in the logic portion 3 so as to penetrate the surface-layered insulating layer 52 and the interlayer insulating layer 43 and to be connected with the wiring 32, and then the wiring 34 (M2) is formed in the surface region of the interlayer insulating layer 43 on the via 33 (dual damascene).

Figure 4:
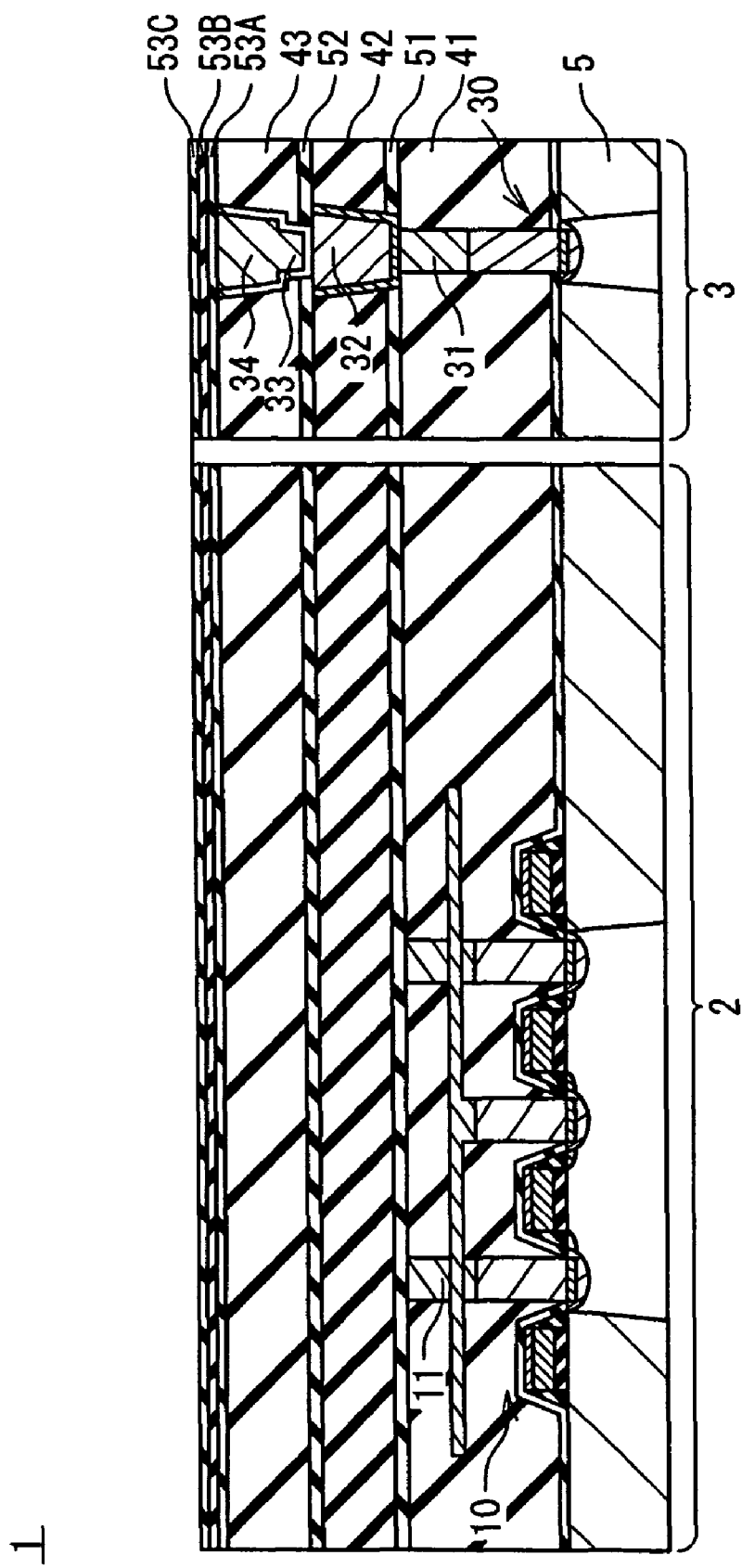
FIG. 4 is a cross-sectional view showing a manufacturing method of the semiconductor device according to an embodiment of the present invention.

After a process of forming the wiring 34 by CMP (Chemical Mechanical Polishing), a SiCN film 53A is grown in approximately e.g. 10 nm thick on the entire surface of the semiconductor substrate 5 under a conventional condition. Subsequently, a SiC film 53B is grown in approximately e.g. 30 nm thick. Then, as shown in FIG. 4, a SiCN film 53C is further grown in approximately e.g. 10 nm thick on the entire surface of the semiconductor substrate 5 under the conventional condition. Thus, a laminated multilayer structure of the SiCN film 53C/SiC film 53B/SiCN film 53A is formed.

Figure 5:
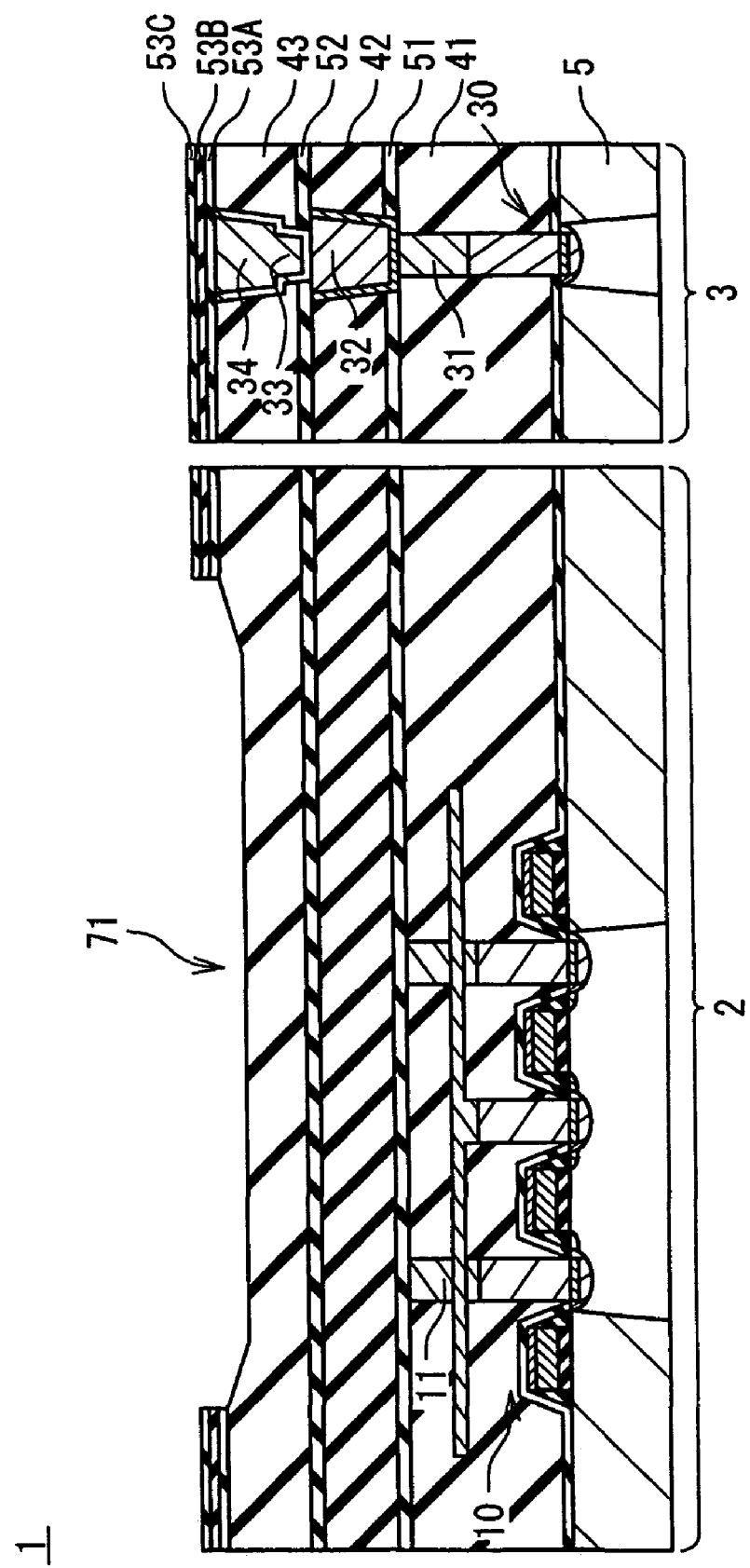
FIG. 5 is a cross-sectional view showing a manufacturing method of the semiconductor device according to an embodiment of the present invention.

Next, as shown in FIG. 5, a reverse photo resist is formed to have a pattern of a region for forming the plurality of capacitance portions 12 in the memory portion 2. Then, using the pattern, the SiCN film 53C/SiC film 53B/SiCN film 53A and the upper surface region of the interlayer insulating layer 43 (e.g., a low-k film) is etched back. The etch back amount at this time corresponds to the depth of: total film thickness of the upper electrode 13/upper electrode 12A/dielectric film 12B (e.g., W film: 20 nm/TiN film: 20 nm/ZrO$_2$ film: 10 nm) minus total film thickness of SiC film 53B/SiCN film 53A (e.g., SiC film: 30 nm/SiCN film: 10 nm) plus 10 nm, from the surface of the SiCN film 53C. As a result of this, there is formed a wide and shallow flat concave portion 71 in the region for forming the capacitance portions 12 in the memory portion 2. At this time, a reverse reticle of the upper electrode 13 (capacitance plate), a LDD (Lightly Doped Drain)' reticle of a memory cell transistor, a PW (p-well) reticle of the memory portion 2 or the like can be used. In other words, it is not necessary to design or manufacture an additional reticle, which reduces a cost and so forth.

Figure 6:
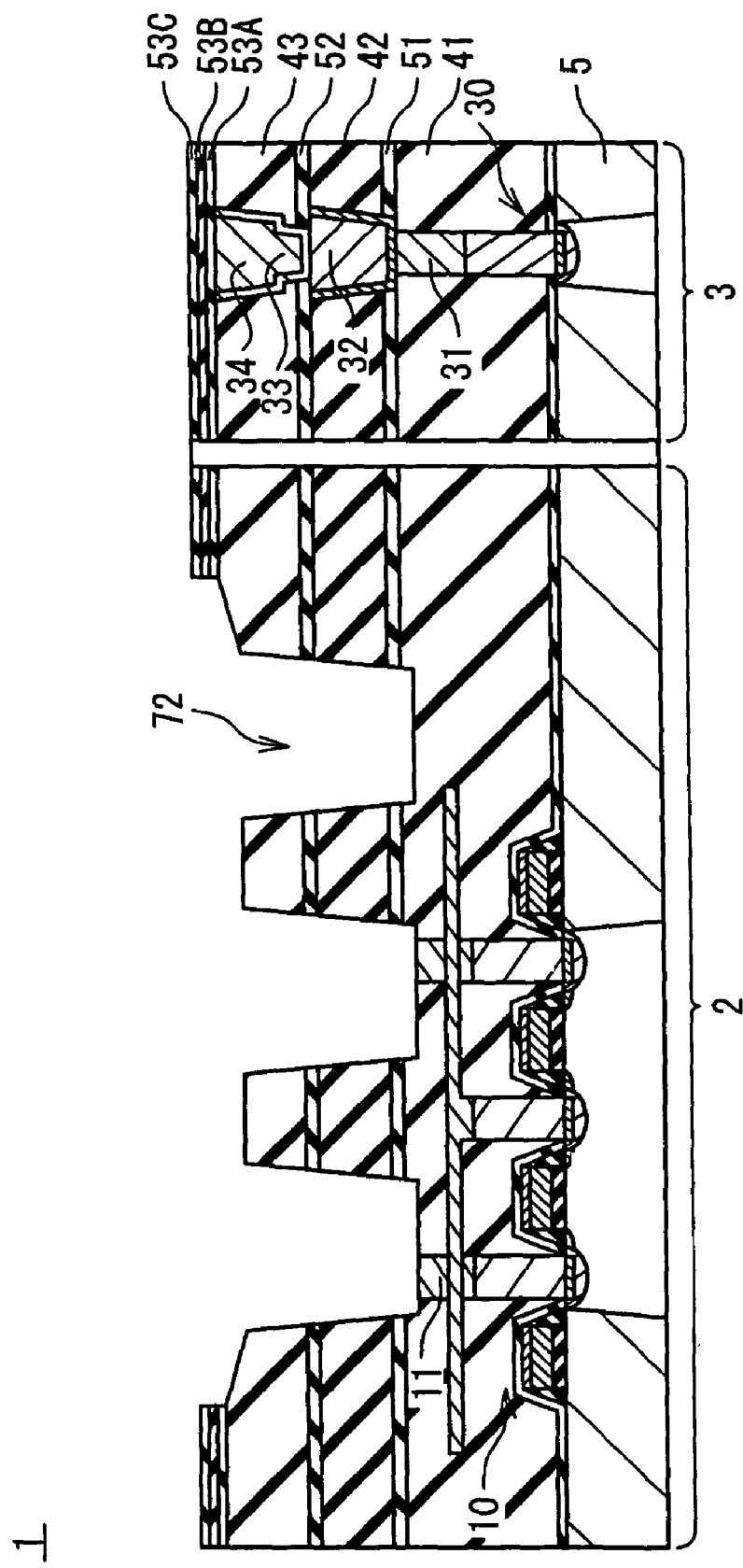
FIG. 6 is a cross-sectional view showing a manufacturing method of the semiconductor device according to an embodiment of the present invention.

Next, as shown in FIG. 6, there is formed a photo resist having a pattern of a plurality of cylinders for the plurality of capacitance portions 12. Then, using the pattern, the interlayer insulating layer 43, the surface-layered insulating layer 52 (e.g., SiC film/SiCN film), the interlayer insulating layer 42 (e.g., low-k film) and the surface-layered insulating layer 51 (e.g., SiC film/SiCN film) are etched back. At this time, the etching is advanced to the lower surface of the surface-layered insulating layer 51, and is stopped when reaching the upper surface portion of the interlayer insulating layer 41 (e.g., SiO$_2$ film). Thus, a plurality of cylinders 72 are formed for the plurality of capacitance portions 12 in the memory portion 2.

Figure 7:
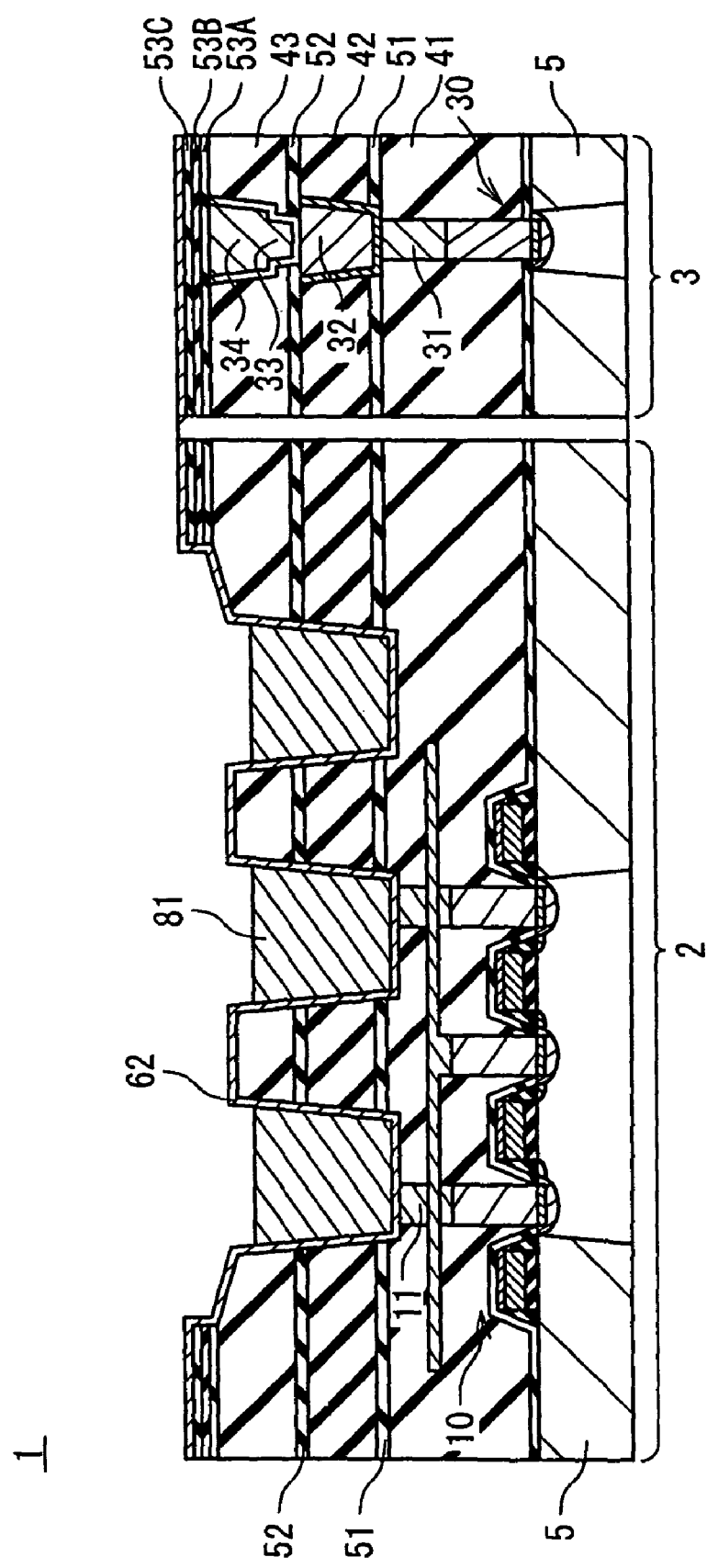
FIG. 7 is a cross-sectional view showing a manufacturing method of the semiconductor device according to an embodiment of the present invention.

Subsequently, as shown in FIG. 7, a metal film 62 (e.g., TiN film) for the lower electrode is formed on the entire surface of the semiconductor substrate 5 by an ALD (Atomic Layer Deposition) method, a MOCVD (Metal Organic Chemical Vapor Deposition) method or the like. At this time, the metal film 62 is grown to a side surface and a bottom surface of the cylinder 72. Therefore, the metal film 62 is connected to the contact 11 and is also connected to the interlayer insulating layer 41 and so forth. Next, an etch-back-protecting photo resist 81 is embedded inside the cylinders 72 (the etch-back-protecting photo resist 81 is retained inside the cylinders 72). This etch-back-protecting photo resist 81 protects the metal film 62 inside the cylinder 72 at the time of etching back the metal film 62.

Figure 8:
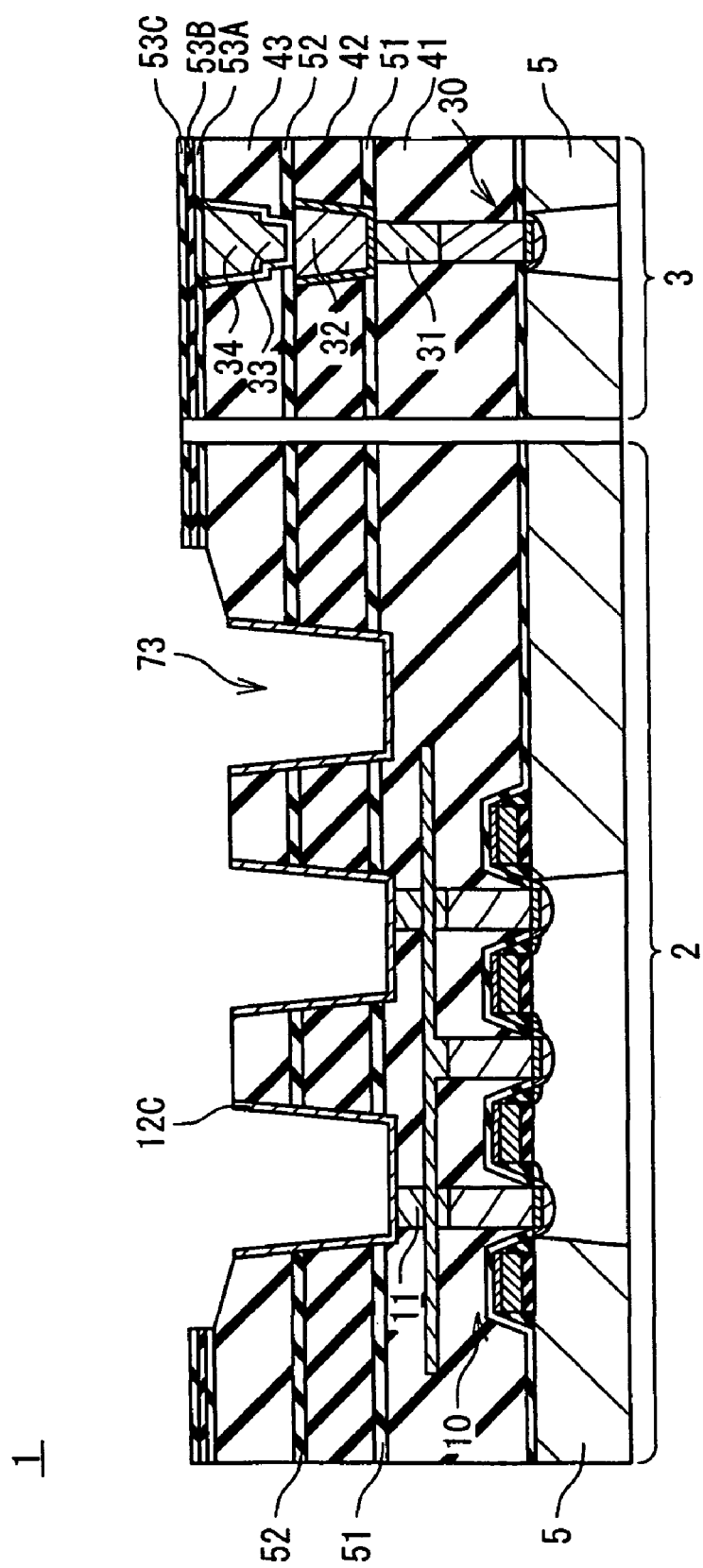
FIG. 8 is a cross-sectional view showing a manufacturing method of the semiconductor device according to an embodiment of the present invention.

Then, as shown in FIG. 8, the metal film 62 on the SiCN film 53C and outside the cylinder 72 is etched back. As a result of this, the metal film 62 remains only on the side wall and the bottom surface of the cylinder 72 so that the lower electrode 12C is formed. That is, there is formed a cylinder 73 with its side wall and bottom surface covered with the lower electrode 12C. Thereafter, the etch-back-protecting photo resist 81 is removed.

Figure 9:
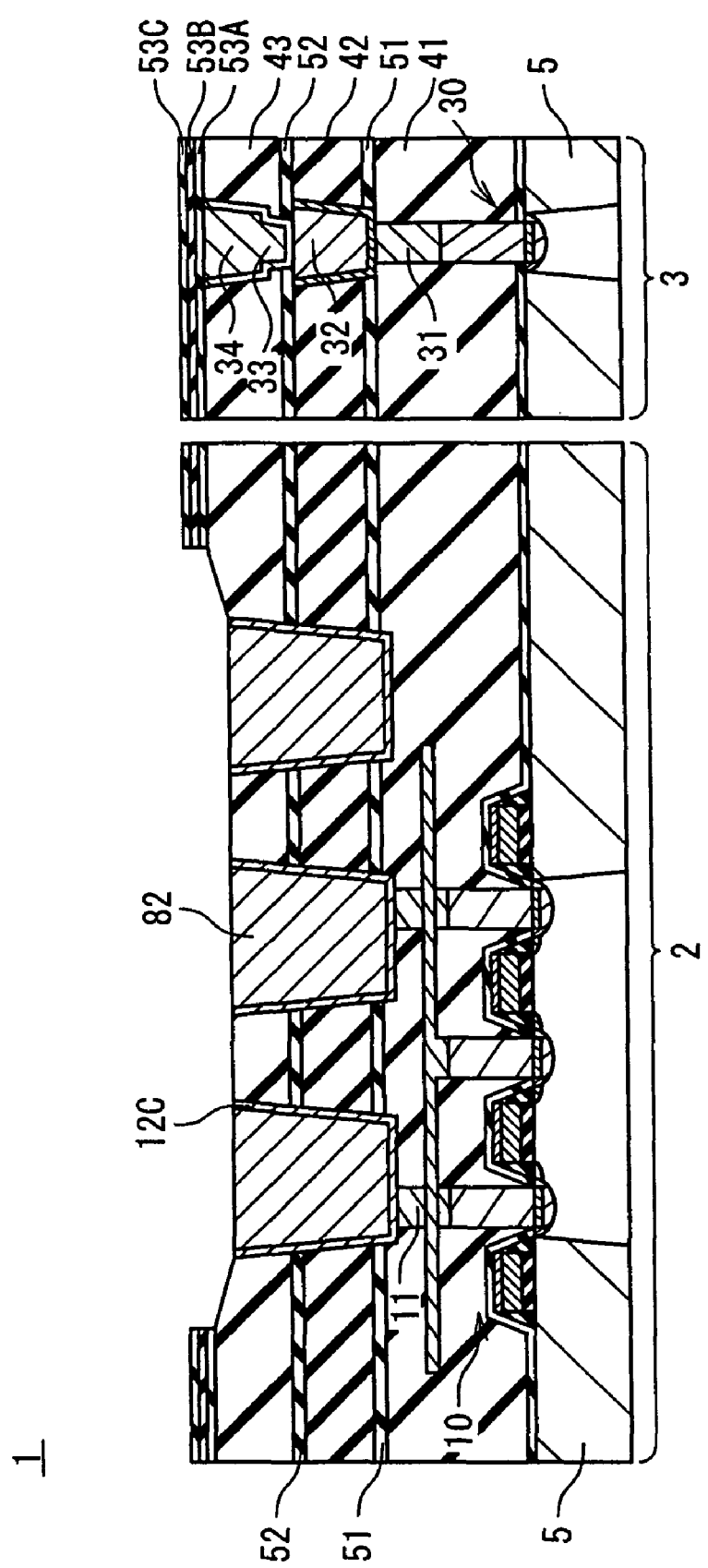
FIG. 9 is a cross-sectional view showing a manufacturing method of the semiconductor device according to an embodiment of the present invention.

Next, as shown in FIG. 9, an etch-back-protecting photo resist 82 is embedded inside the cylinders 73 again (the etch-back-protecting photo resist 82 is retained inside the cylinders 73). The reason why the etch-back-protecting photo resist 82 is newly embedded is because it is considered that the last etch-back-protecting photo resist 81 is deteriorated. This etch-back-protecting photo resist 82 protects the lower electrode 12C inside the cylinders 73 at the time of etching back the interlayer insulating layer 43.

Figure 10:
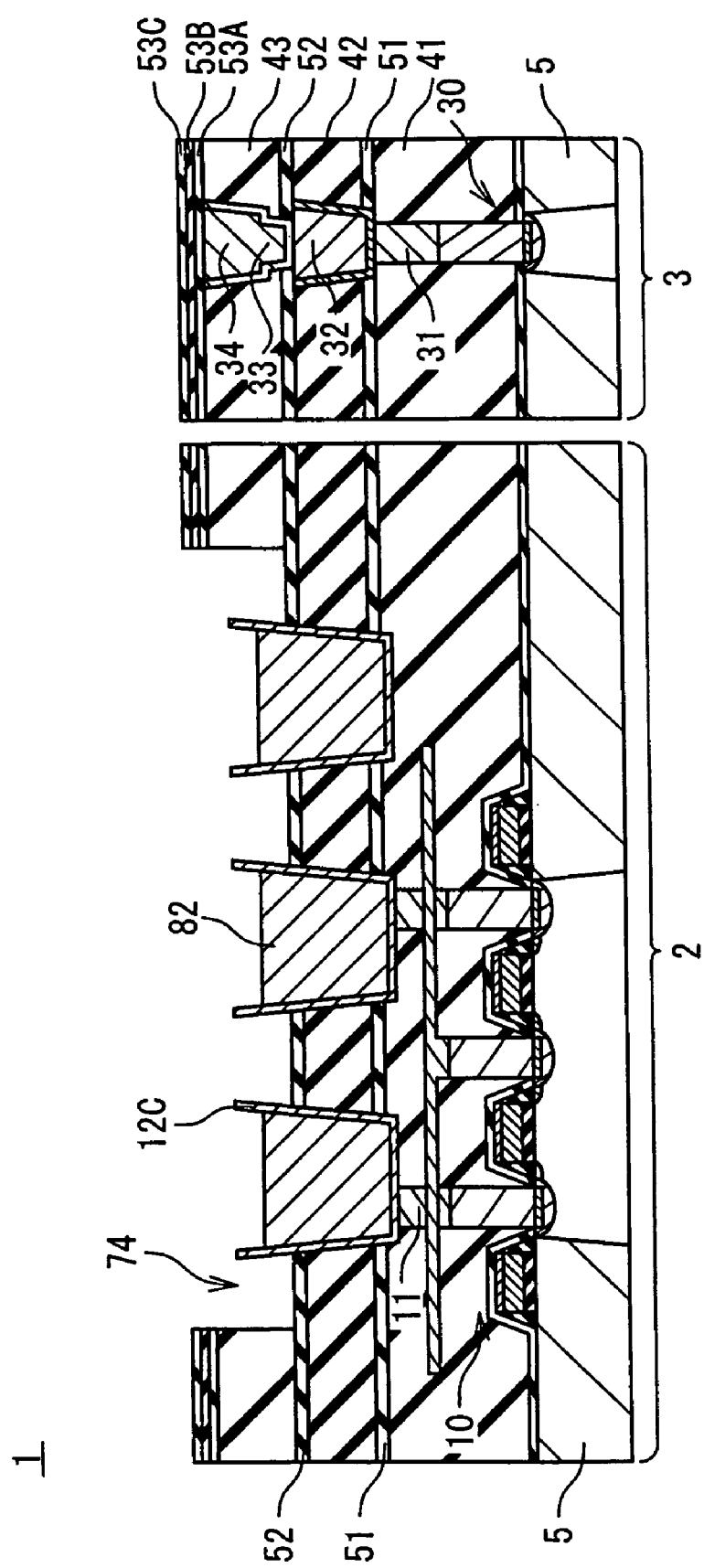
FIG. 10 is a cross-sectional view showing a manufacturing method of the semiconductor device according to an embodiment of the present invention.
Figure 11:
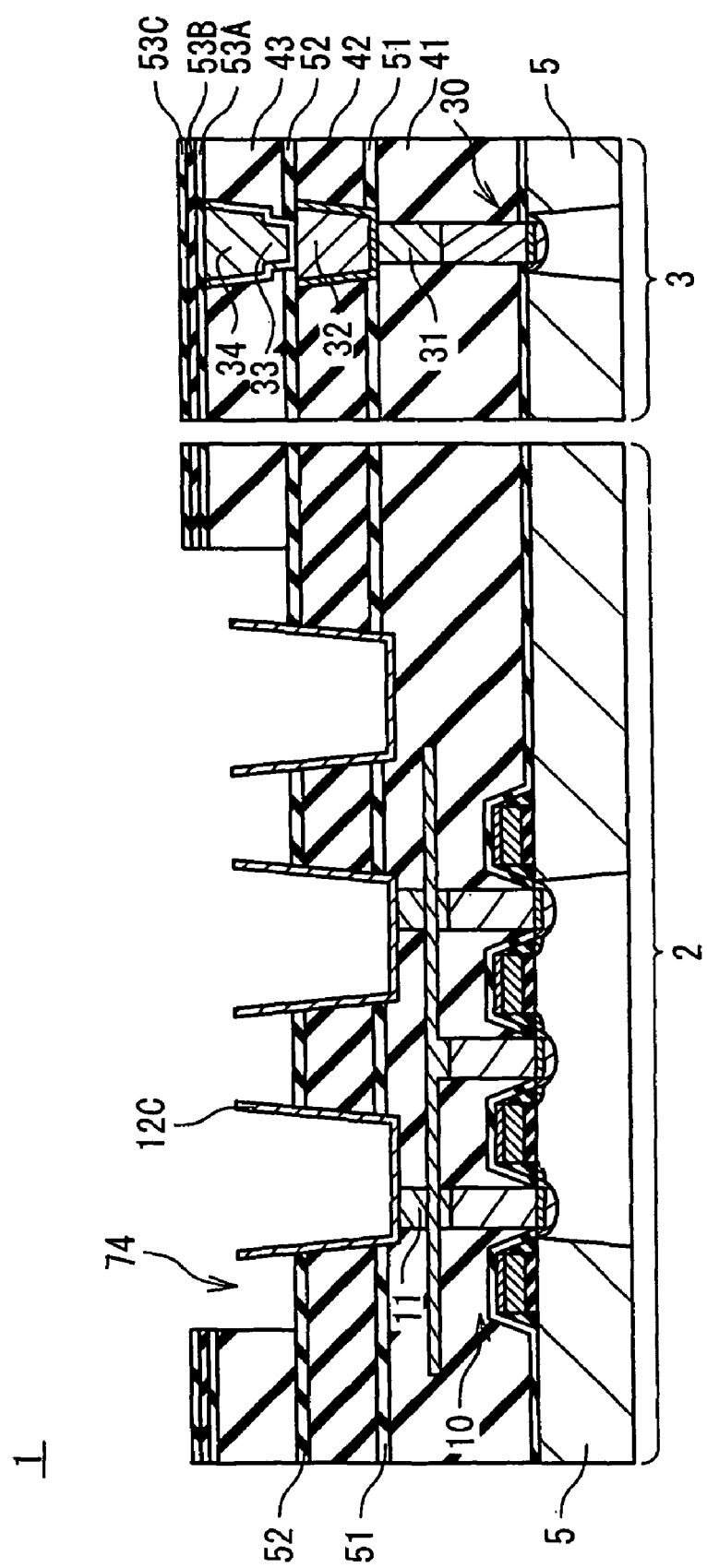
FIG. 11 is a cross-sectional view showing a manufacturing method of the semiconductor device according to an embodiment of the present invention.

Subsequently, as shown in FIG. 10, as to the region for forming the plurality of capacitance portions 12 in the memory portion 2, the interlayer insulating layer 43 is etched back using the laminated film of SiCN film 53C/SiC film 53B/SiCN film 53A as a mask under the condition that the lower electrode 12C is not etched. At this time, the surface-layered insulating layer 52 serves as a stopper of the etching. Thus, a groove portion 74 is formed surrounding the cylinder 73 including the lower electrode 12C. Thereafter, the etch-back-protecting photo resist 82 is removed as shown in FIG. 11.

Figure 12:
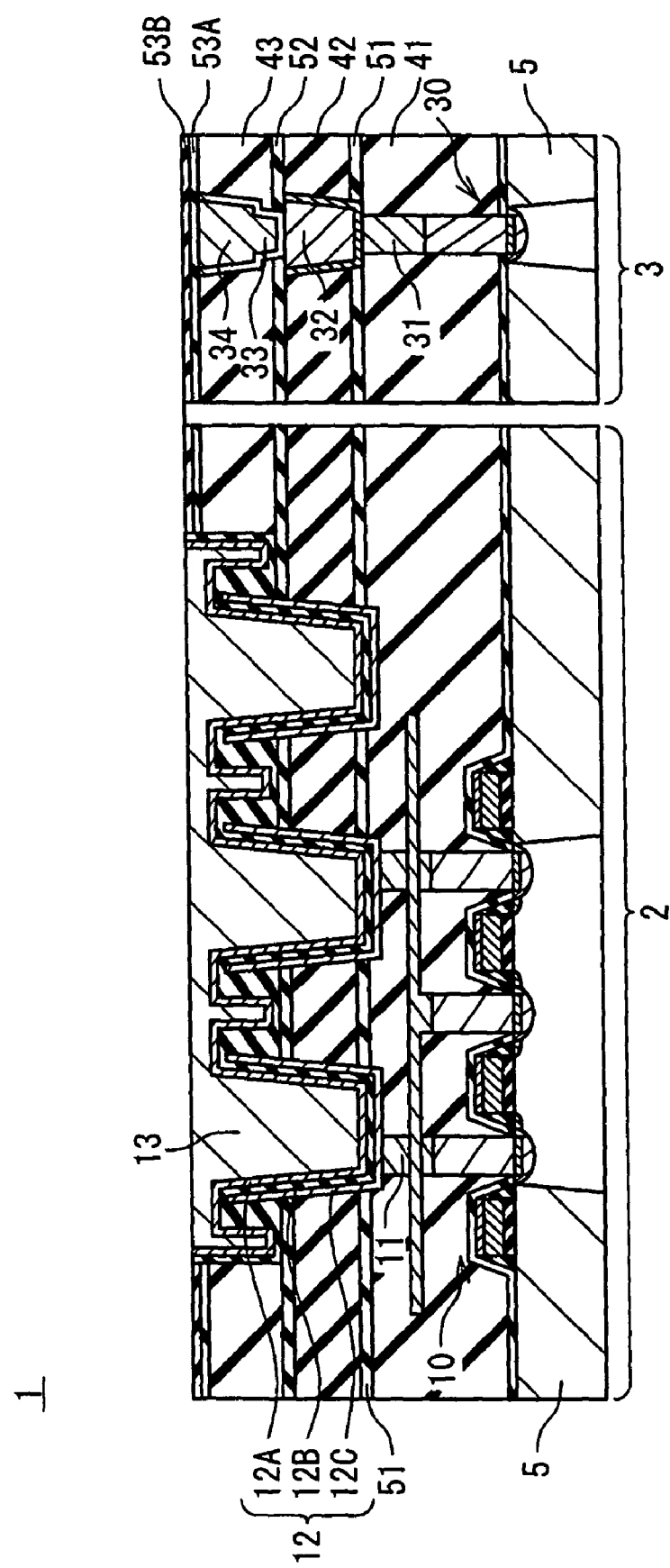
FIG. 12 is a cross-sectional view showing a manufacturing method of the semiconductor device according to an embodiment of the present invention.

Next, as shown in FIG. 12, the dielectric film (e.g., ZrO$_2$ film) of a prescribed thickness and the upper electrode film (e.g., TiN film) of a prescribed thickness are formed on the entire surface of the semiconductor substrate 5. Subsequently, another upper electrode film (e.g., W film) is grown by a CVD method so as to be buried in the cylinders 73 on the upper electrode film. Thereafter, there is formed an etching protecting photo resist having a pattern of a region for forming the plurality of capacitance portions 12, and using the same as a mask, the dielectric film, the upper electrode film and the other upper electrode film are etched back. At this time, the etching is stopped when reaching the SiCN film 53C. The SiCN film 53C is made very thin or disappears by the etching to form the surface-layered insulating layer 53 (53A+53B). As a result of this etching, the film thickness of the surface-layered insulating layer 53 (i.e., generally including SiC film 53B/SiCN film 53A) is approximately e.g. 40 nm. In consideration of such a case where the etching is exceeded to the SiC film 53B according to a condition of the etching, the SiC film (SiC film 53B) may be replaced by a new one when necessary in order to ensure a function as an etching stopper film. Thereafter, the etching protecting photo resist is removed. Thus, the plurality of capacitance portions 12 (each including the lower electrode 12C, the dielectric layer 12B, the upper electrode 12A and the upper electrode 13) is formed in the memory portion 2.

Figure 13:
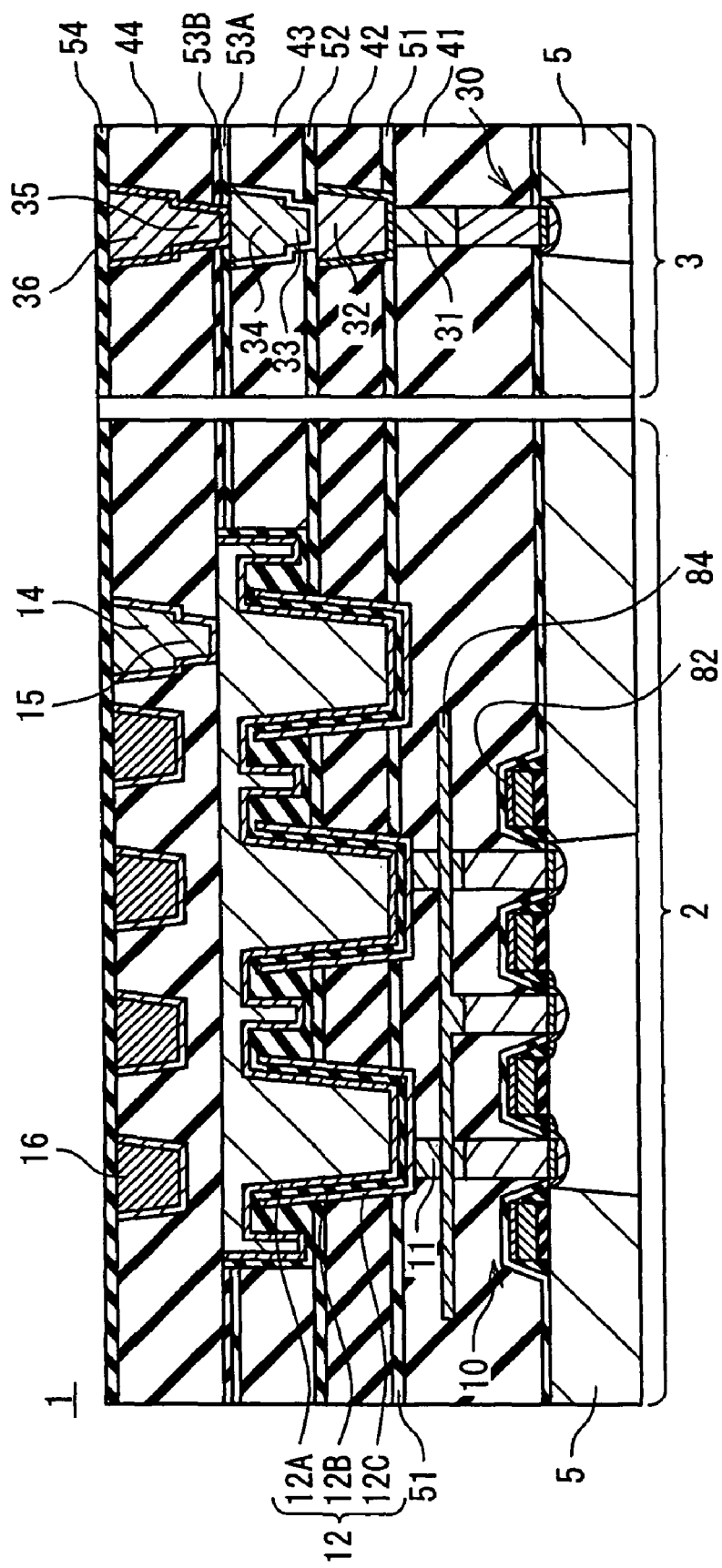
FIG. 13 is a cross-sectional view showing a manufacturing method of the semiconductor device according to an embodiment of the present invention.

Thereafter, as shown in FIG. 13, the interlayer insulating layer 44 (e.g., low-k film) is formed on the surface-layered insulating layer 53. Subsequently, in the logic portion 3, the via 35 (V2) is formed to penetrate the surface-layered insulating layer 53 and the interlayer insulating layer 44 and to be connected with the wiring 34, and the wiring 36 (M3) is formed in the surface region of the interlayer insulating layer 44 on the via 35 (dual damascene). At the same time of this, in the memory portion 2, the via 15 (V2) is formed to penetrate the surface-layered insulating layer 53 and the interlayer insulating layer 44 and to be connected with the upper electrode 13, and the wiring 14 (M3) is formed in the surface region of the interlayer insulating layer 44 on the via 15 (dual damascene), and the wiring 16 (M3) is formed in the surface region of the interlayer insulating layer 44. In the memory portion 2, although the surface-layered insulating layer 53 is not provided as an etching stopper, if the upper electrode 13 is formed of a W film, the upper electrode 13 serves as the etching stopper. Therefore, when the via 15 is formed, there is no problem even if the surface-layered insulating layer 53 is not provided.

By the processes mentioned above, the semiconductor device according to the embodiment of the present invention is manufactured.

According to the present embodiment, the following effects can be obtained.

Figure 1:
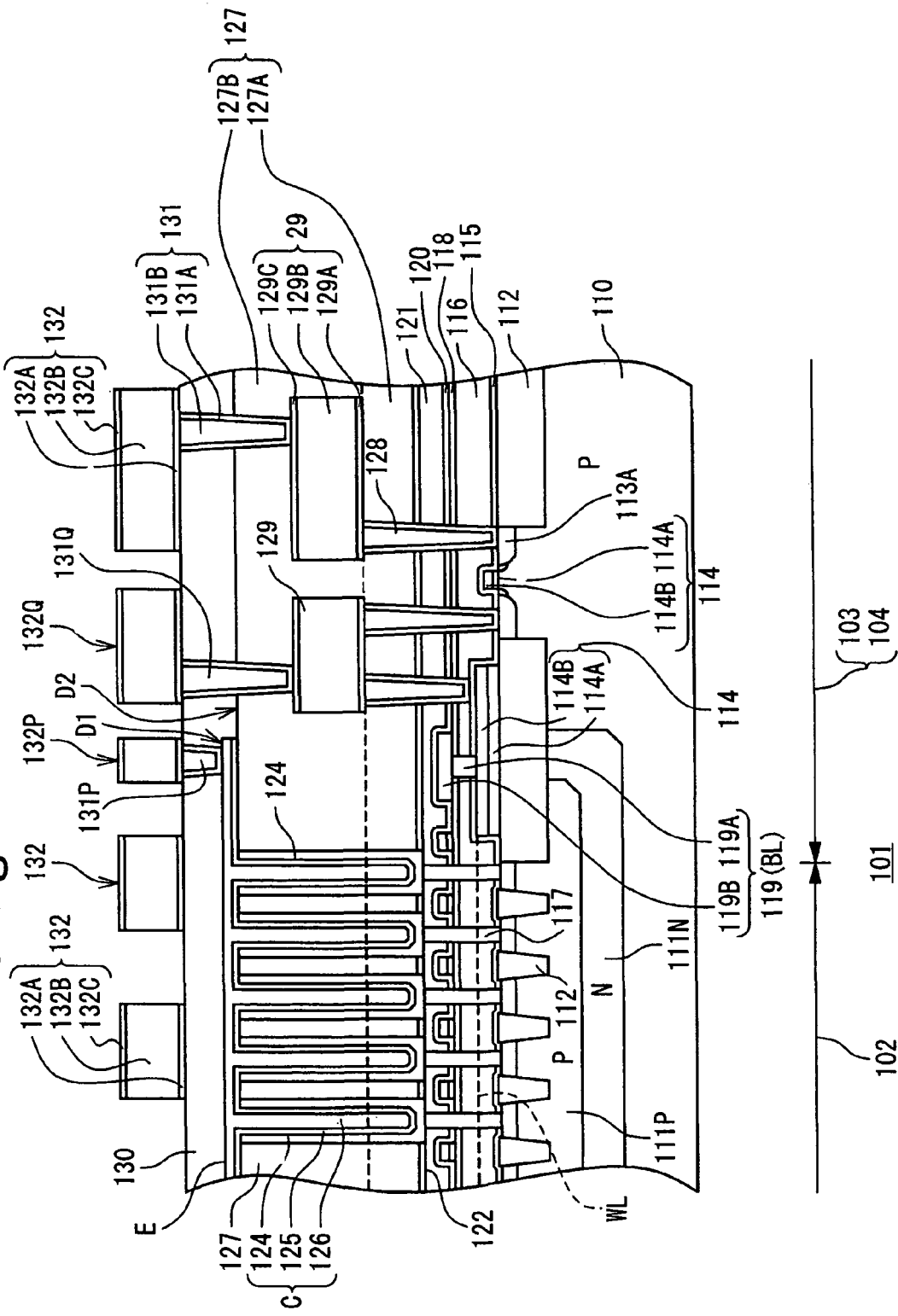
FIG. 1 is a cross-sectional view showing a configuration of a semiconductor device disclosed in JP2000-332216A.

Generally, in a semiconductor device having a memory portion (e.g., DRAM) and a logic portion co-loaded therein, a manufacturing method thereof is considered such that, after a wiring process is executed in the logic portion, a capacitance portion is formed in the memory portion, and subsequently a wiring process for the upper wiring is executed both in the memory portion and the logic portion. In this case, however, as described with reference to FIG. 1, there may be possibly formed a step due to formation of the capacitance portion. If a step is formed, it may possibly be difficult to execute a wiring process thereafter. If so, a short circuit may possibly occur between the upper electrode and the upper layer wiring, an open or short circuit of a via for the upper layer wiring, or an open or short circuit of the wiring.

Figure 14:
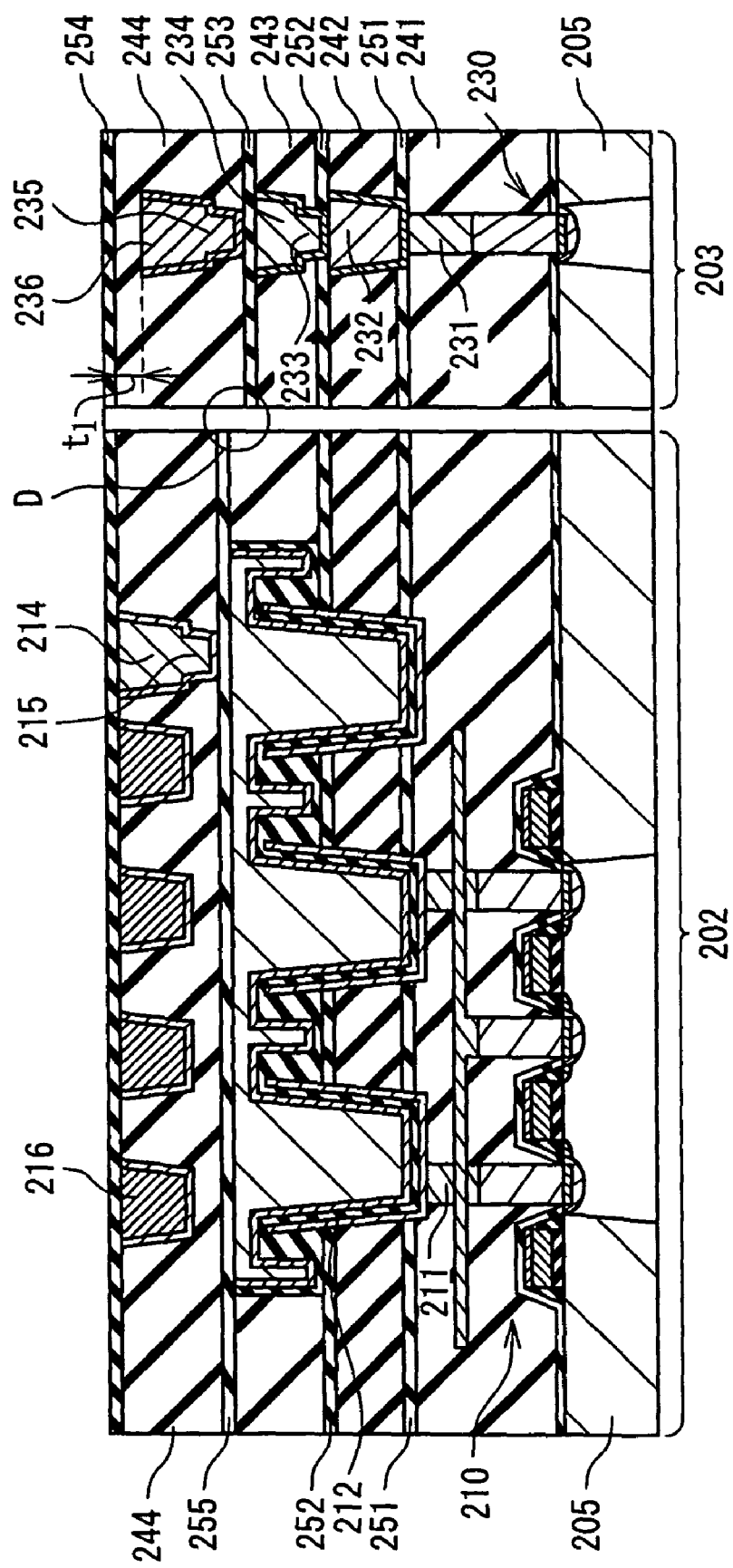
FIG. 14 is a cross-sectional view showing a configuration of a semiconductor device according to a comparative example.

Further, as shown in FIG. 14, it may be considered that a step D is absorbed in a thickness of an interlayer insulating layer 244. In this case, however, if a via 215 and a wiring 214 are made to correspond to a wiring design parameter in the memory portion 202 and if a via 235 and a wiring 236 in the logic portion 203 are similarly made correspond to the wiring design parameter, a height difference t1 occurs between the wiring 214 and the via 215 and the wiring 236 and the via 235 to be formed as the same layers. If such a height difference occurs, it is not possible to make the design correspond to the wiring design parameter thereafter, and it becomes difficult to predict a resistance value of the via or the wiring, and an error may be easily caused and it becomes difficult to design the via and the wiring. If a CMP process is added in order to reduce the height difference t1 (i.e., height difference to the memory portion 202), a wiring formed above a DRAM cell array portion is also CMP processed at the same time, so that the height of the wiring in the memory portion 202 is reduced, and there arises a problem of increasing a wiring resistance.

Figure 15:
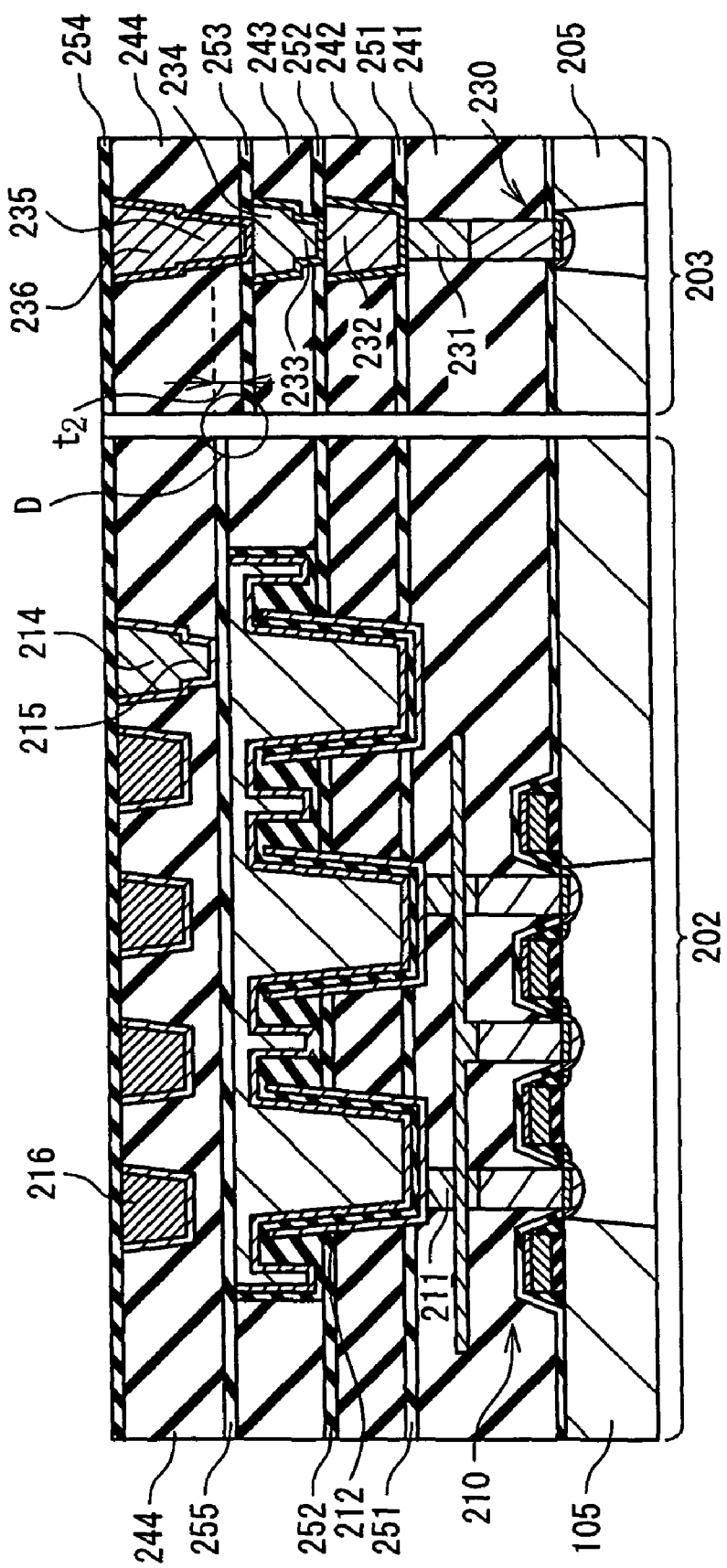
FIG. 15 is a cross-sectional view showing a configuration of the semiconductor device according to the comparative example.

Further, as shown in FIG. 15, it may be considered that a step height D is absorbed by a height of the via 235. In this case, however, since the height of the via 235 does not correspond to a wiring design parameter (height difference t2), it is not possible to perform the design thereafter in conformity with the wiring design parameter. In particular, the resistance of the via becomes largely irregular and an open failure and a significant reduction may possibly occur, resulting in difficulty of a stable manufacturing.

In the present embodiment, after the wirings 34 and 32 etc. in the logic portion 3 are formed, the region for forming the capacitance portions 12 is etched back to form, e.g., the concave portion 71 as shown in FIG. 5, and thereafter the openings of the plurality of capacitance portions 12 are formed. Thus, the height of the upper electrode 13 commonly shared to the plurality of capacitance portions 12 from the semiconductor substrate 5 can be made to correspond to the height of the upper surface of the surface-layered insulating layer 53 from the semiconductor substrate 5. That is, a step (e.g., the step D in FIGS. 14 and 15) caused after a process of forming the capacitance portions 12 can be eliminated. Since a step is not generated, the vias (15, 35) and the wirings (14/16, 36) of the memory portion 2 and the logic portion 3 can be formed in the same process on the plane formed of the surface-layered insulating layer 53 and the upper electrode 13 using the wiring design parameter under a normal logic wiring condition after the process of forming the plurality of capacitance portions 12. In other words, the via 15 (contact) and the wirings 14 and 16 on the upper electrode 13 can be formed under the standard condition (same condition) of the logic circuit, similarly to the via 35 and the wiring 36 in the logic portion 3. Therefore, the compatibility of the wiring design parameter can be ensured. Thus, in the present embodiment, the compatibility of designing between the memory portion and the logic portion can be increased. Particularly, in the wiring process, the compatibility thereof can be remarkably increased.

In the present embodiment, further, by using an etching stopper film (i.e., surface-layered insulating layer 51 and 52) necessary for forming the wiring 32 and the via 33, more three-dimensional (e.g., half crown shape) MIM structure can be realized. Thus, the reduction of capacitance due to scale-down in size of the memory cell can be suppressed using a three-dimensional (half crown type or crown type) MIM capacitance, and the MIM capacitance can be ensured with a minimum additional process. Moreover, when a wiring is formed, the MIM capacitances are formed as the plurality of capacitance portions between the wiring layers without using a wiring in the memory portion, and thus the capacitance value and a contact resistance and a capacitance between the contacts can be reduced.

Figure 16:
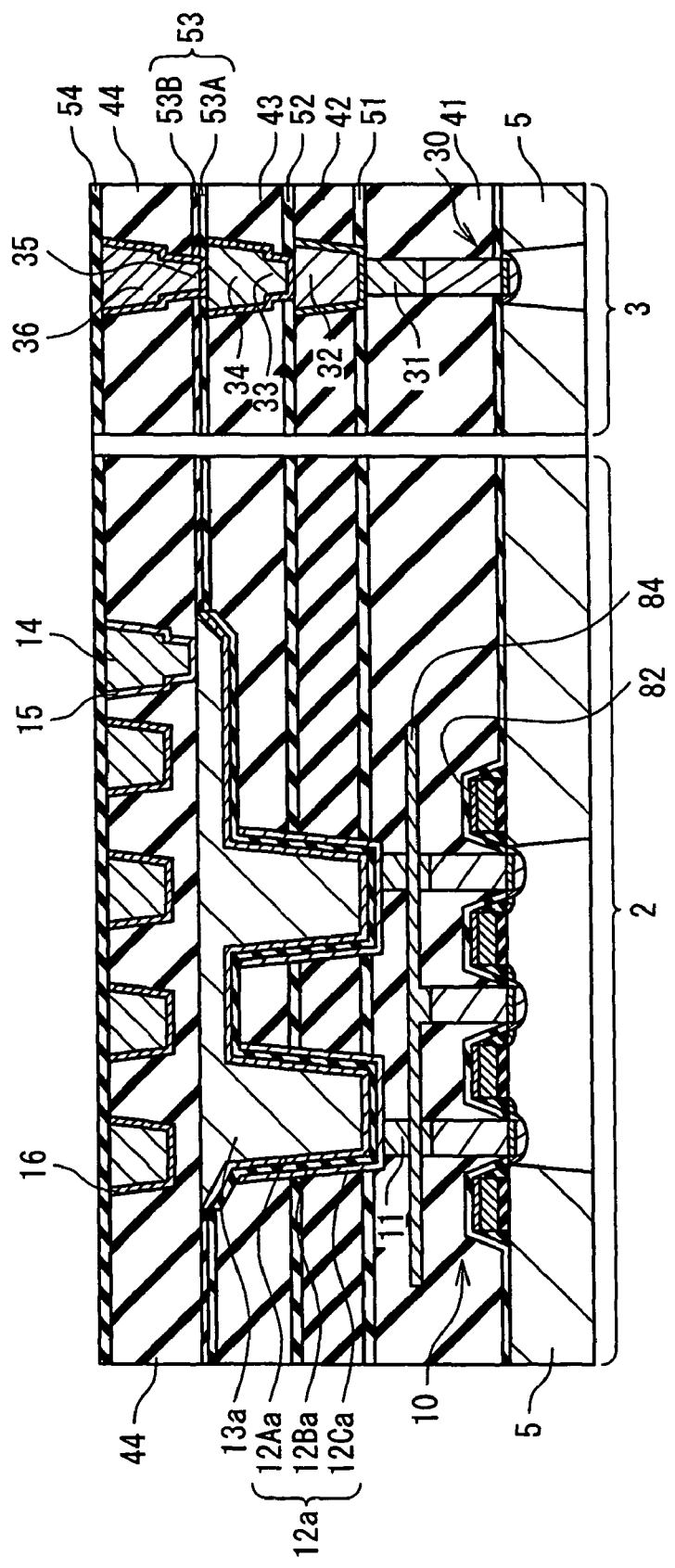
FIG. 16 is a cross-sectional view showing another configuration of the semiconductor device according to an embodiment of the present invention.

Note that the present invention is not limited to the embodiment mentioned above. FIG. 16 is a cross-sectional view showing another configuration of the semiconductor device according the embodiment of the present invention. In this semiconductor device 1a, each of the plurality of capacitance portions 12a is not a half crown type but a cylinder type. The other configurations are similar to that shown in FIG. 2. In the manufacturing method mentioned above, after executing the processes shown in FIGS. 3 to 8, the processes shown in FIGS. 9 to 11 are omitted and then the processes shown in FIGS. 12 and 13 are executed, the manufacturing method can be realized.

It is apparent that the present invention is not limited to the above embodiment, but may be modified and changed without departing from the scope and spirit of the invention.

Although the present invention has been described above in connection with several exemplary embodiments thereof, it would be apparent to those skilled in the art that those exemplary embodiments are provided solely for illustrating the present invention, and should not be relied upon to construe the appended claims in a limiting sense.

What is claimed is:

1. A manufacturing method of a semiconductor device comprising:
    forming a wiring in a first interlayer insulating layer in a first region;
    etching a surface portion of said first interlayer insulating layer in a second region;
    forming a plurality of opening portions extended below in said etched region; and
    forming a lower electrode layer, a dielectric layer, and a common upper electrode in each of said plurality of opening portions to form a plurality of capacitance portions,
    wherein said forming said plurality of capacitance portions, includes:
    forming said common upper electrode so that an upper surface of said first interlayer insulating layer and an upper surface of said common upper electrode approximately lie in the same plane.

2. The manufacturing method of a semiconductor device according to claim 1, wherein said first interlayer insulating layer includes:
an etching stopper film configured to be formed on said upper surface of said first interlayer insulating layer, wherein said etching, includes:
etching said surface portion of said first interlayer insulating layer including said etching stopper film, and
wherein an upper surface of said etching stopper film and said upper surface of said common upper electrode approximately lie in the same plane.

3. The manufacturing method of a semiconductor device according to claim 2, further comprising:
forming a second interlayer insulating film on said first interlayer insulating film in said first region and said second region; and
forming a first via extending from an upper surface of said wiring toward an upper side and a first upper wiring on said first via in said second interlayer insulating layer in said first region, and forming a second via extending from an upper surface of said common upper electrode toward an upper side and a second upper wiring on said second via in said second interlayer insulating layer in said second region,
wherein a height of said first via and a height of said second via from a surface of a substrate are approximately the same.

4. The manufacturing method of a semiconductor device according to claim 3, wherein each of said plurality of capacitance portions is a capacitance element selected from a group of a cylinder type capacitance element, a half-crown type capacitance element, and a crown type capacitance element.

5. The manufacturing method of a semiconductor device according to claim 4, wherein said plurality of opening portions is formed through said first interlayer insulating layer and at least one interlayer insulating layer formed below said first interlayer insulating layer.

6. The manufacturing method of a semiconductor device according to claim 5, wherein a logic circuit is formed in said first region, and a memory is formed in said second region.

7. The manufacturing method of a semiconductor device according to claim 1, further comprising:
forming a second interlayer insulating film on said first interlayer insulating film in said first region and said second region; and
forming a first via extending from an upper surface of said wiring toward an upper side and a first upper wiring on said first via in said second interlayer insulating layer in said first region, and forming a second via extending from an upper surface of said common upper electrode toward an upper side and a second upper wiring on said second via in said second interlayer insulating layer in said second region,
wherein a height of said first via and a height of said second via from a surface of a substrate are approximately the same.

8. The manufacturing method of a semiconductor device according to claim 1, wherein each of said plurality of capacitance portions is a capacitance element selected from a group of a cylinder type capacitance element, a half-crown type capacitance element, and a crown type capacitance element.

9. The manufacturing method of a semiconductor device according to claim 1, wherein said plurality of opening portions is formed through said first interlayer insulating layer and at least one interlayer insulating layer formed below said first interlayer insulating layer.

10. The manufacturing method of a semiconductor device according to claim 1, wherein a logic circuit is formed in said first region, and a memory is formed in said second region.

* * * * *